United States Patent
Bergherr et al.

(10) Patent No.: US 6,512,677 B1
(45) Date of Patent: Jan. 28, 2003

(54) ELECTRONIC CONNECTION COVER FOR A HYDRAULIC COMPONENT HOUSING UTILIZING A SEALED PRINTED CIRCUIT BOARD

(75) Inventors: Thomas J. Bergherr, Dayton, MN (US); John Fischbach, Centerville, IA (US)

(73) Assignee: Sauer-Danfoss, Inc., Ames, IA (US)

( * ) Notice: Subject to any disclaimer, the term of this patent is extended or adjusted under 35 U.S.C. 154(b) by 15 days.

(21) Appl. No.: 09/922,754

(22) Filed: Aug. 6, 2001

(51) Int. Cl.[7] .................................................. H05K 5/06
(52) U.S. Cl. ..................... 361/752; 174/50.2; 174/52.3; 417/366
(58) Field of Search ................................. 361/752, 753, 361/823; 174/50, 50.5, 52.2, 52.3; 417/357, 366

(56) References Cited

U.S. PATENT DOCUMENTS

| | | |
|---|---|---|
| 5,063,775 A | 11/1991 | Walker, Sr. et al. |
| 5,863,185 A | 1/1999 | Cochimin et al. |
| 6,070,469 A | 1/2000 | Taniguchi et al. |

*Primary Examiner*—Jayprakash N. Gandhi

(57) ABSTRACT

An electronic connection cover for a hydraulic component has a housing structure having an interior compartment and an electronic control element in the interior compartment. The housing structure has a face for interfacing a hydrostatic component housing. A printed circuit board is affixed to the face of the housing structure with a printed circuit thereon on a side thereof opposite to the housing structure. The printed circuit is connected to the electronic control element. Electrical contacts extend from the printed circuit through the printed circuit board and the electronic connection cover for external connection to an exterior circuit. A seal element is located between the printed circuit board and the electronic control circuit which surrounds the area where the electrical contacts extend through the printed circuit board.

5 Claims, 5 Drawing Sheets

ELECTRONIC CONNECTION COVER FOR A HYDRAULIC COMPONENT HOUSING UTILIZING A SEALED PRINTED CIRCUIT BOARD

BACKGROUND OF THE INVENTION

The interconnection of the electronics in a hydraulic device such as a fluid pump with input energy and control circuitry is typically complicated and susceptible to leakage of hydraulic fluid either into or from the pump housing.

It is therefore a principal object of the invention to provide an electronic connection cover for a hydraulic component housing utilizing a sealed printed circuit board which will permit easy connection of the internal circuitry to an energy source and which will eliminate leakage of fluid into or from the hydraulic component housing.

These and other objects will be apparent to those skilled in the art.

SUMMARY OF THE INVENTION

An electronic connection cover for a hydraulic component housing has a cover housing with interior and exterior compartments, and a face for interfacing with an opening in a hydraulic component housing. An electrical control component is in the interior compartment for electrical control of a hydraulic component in the hydraulic component housing. The face of the cover housing has a terminal wall closing an end to the exterior compartment opposite an end of the exterior compartment.

A printed circuit board is secured to the face of the cover housing and is superimposed over the terminal wall and has an electrical circuit including surface mounted electrical components imposed on one side thereof opposite the terminal wall. The electrical circuit is operatively connected to the electrical control component in the interior compartment.

The surface mounted electrical components are positioned for interaction with electrical control components in a hydraulic component housing to which the cover is attached.

Connecting pins extend from the electrical circuit through the printed circuit board and the terminal wall and protrude into the exterior compartment for connection to exterior circuitry. A seal element is located between the terminal wall and the printed circuit board and surrounds the connecting pins to prevent the passage of hydraulic fluid into or out of a hydraulic component housing to which the cover is attached.

DESCRIPTION OF THE PREFERRED EMBODIMENT

Figure 5:
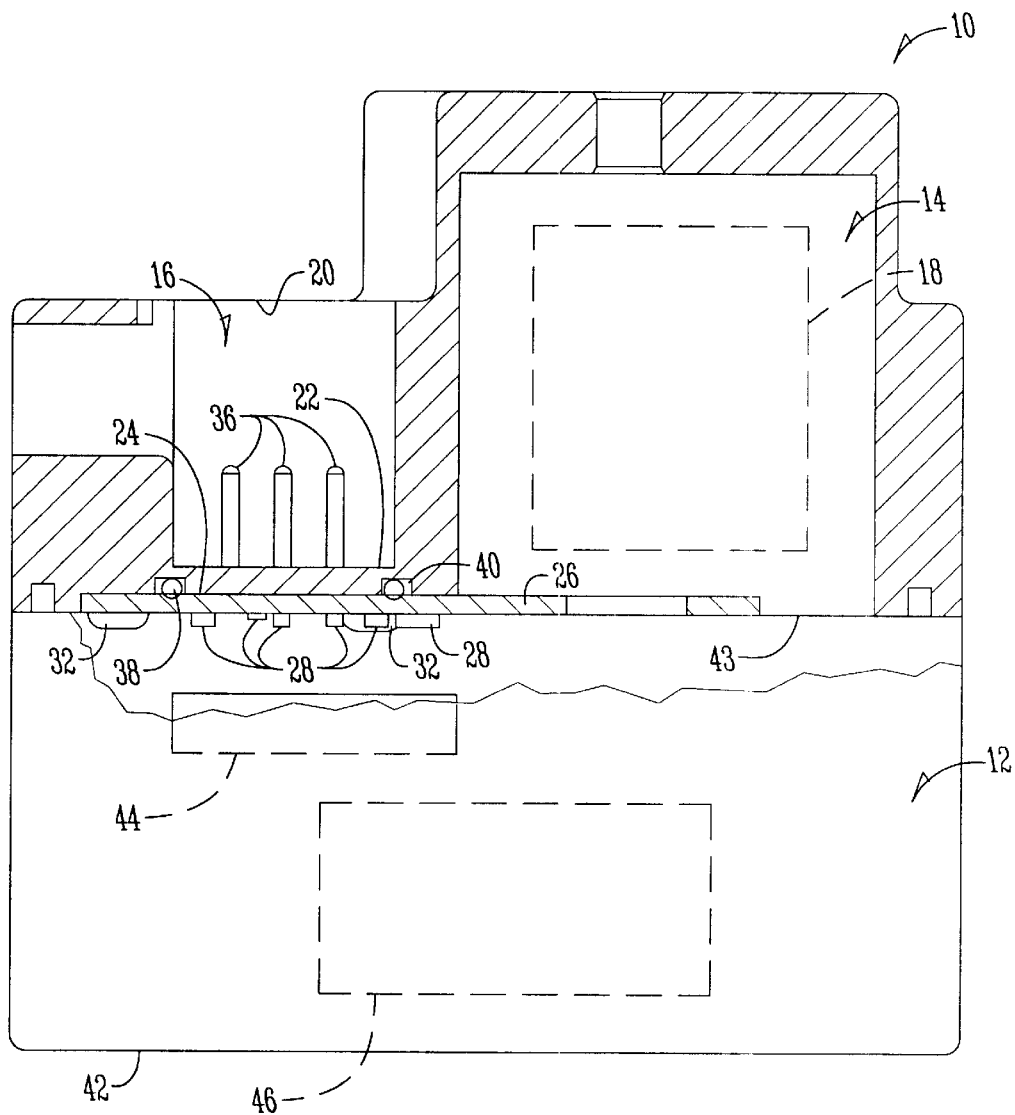
FIG. 5 is a sectional view similar to that of FIG. 3 which shows the cover attached to a hydraulic pump.

With reference to FIG. 5, the numeral 10 designates an electronic connection cover of this invention. The numeral 12 designates a conventional hydraulic component housing to house a hydraulic component such as a pump or the like.

Figure 3:
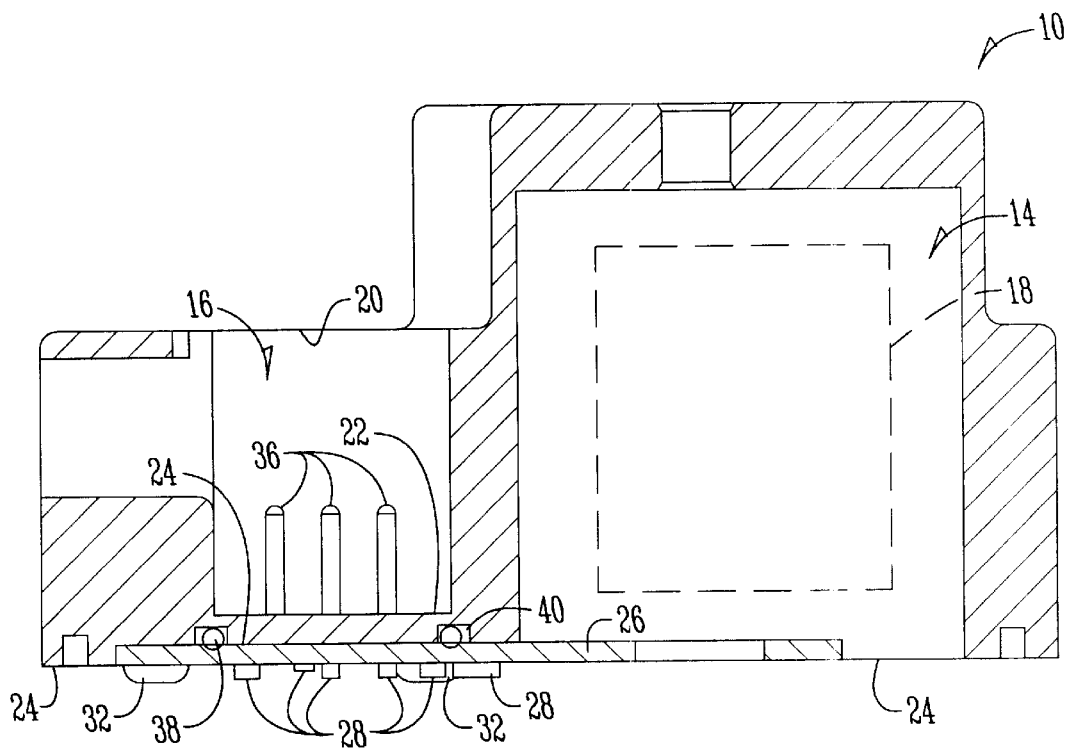
FIG. 3 is a sectional view taken on line 3—3 of FIG. 2.
Figure 4:
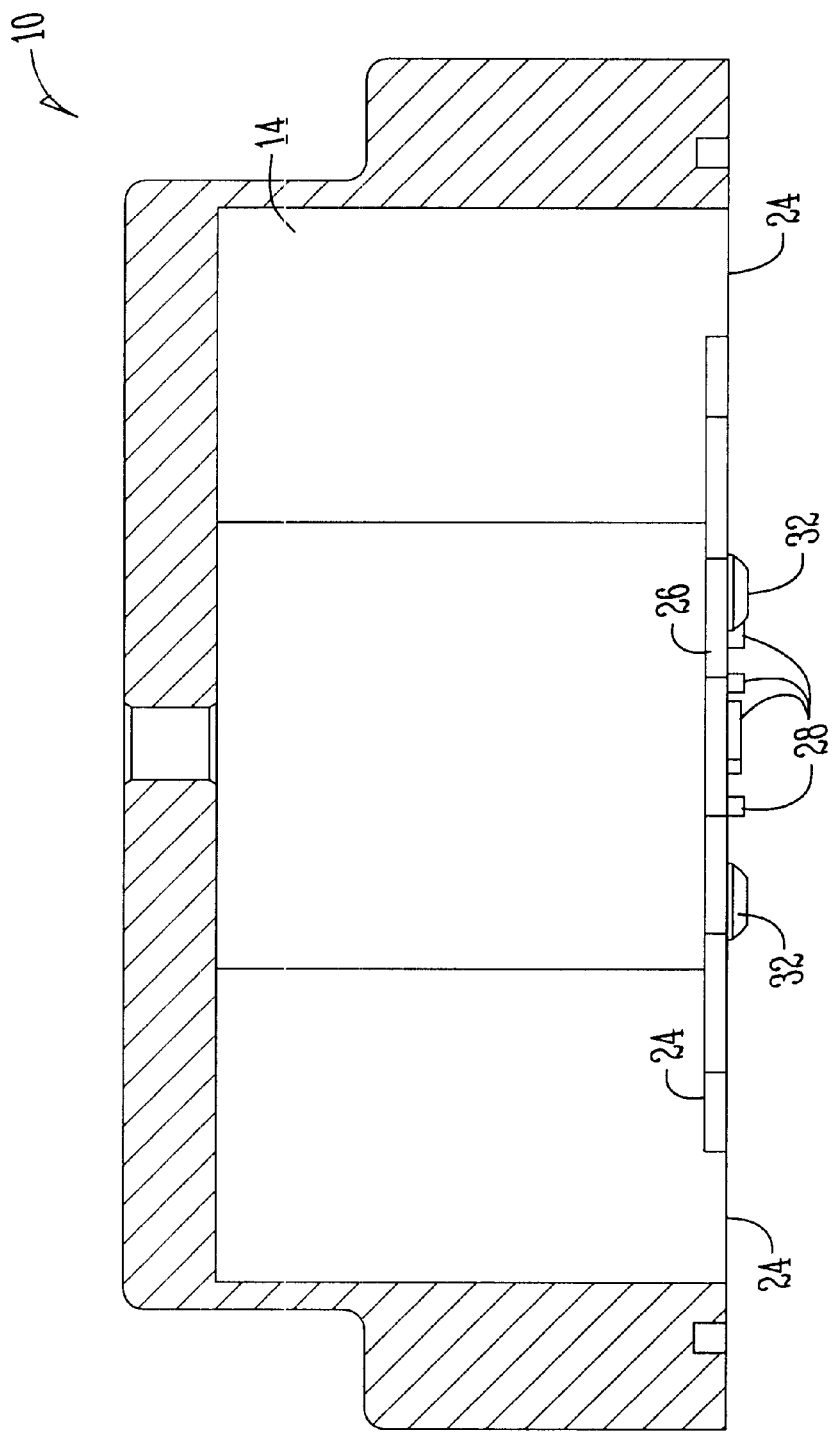
FIG. 4 is a sectional view taken on line 4—4 of FIG. 2.

With reference to FIG. 3, the cover 10 includes an interior compartment 14 and a separate exterior compartment 16. Electrical control components in 14 are designated in dotted lines collectively by the numeral 18 and would typically include a valve, coils, or the like. Exterior compartment 16 has an open top 20, and a terminal wall 22 comprises the bottom of the compartment 16. Cover 10 has a face 24 (FIG. 3) which interfaces with the pump 12 as will be described hereafter.

A printed circuit board 26 is positioned on the face 24 of cover 10 as best shown in FIG. 3. A printed circuit (not shown) is imposed on the side of board 26 opposite to the terminal wall 22. A plurality of surface mounted electrical components 28 are positioned on the board 26 and are a part of the printed circuit thereon. The printed circuit is in electrical contact with the electrical control components 18 in compartment 14. These interconnections are typical and are not shown.

Figure 1:
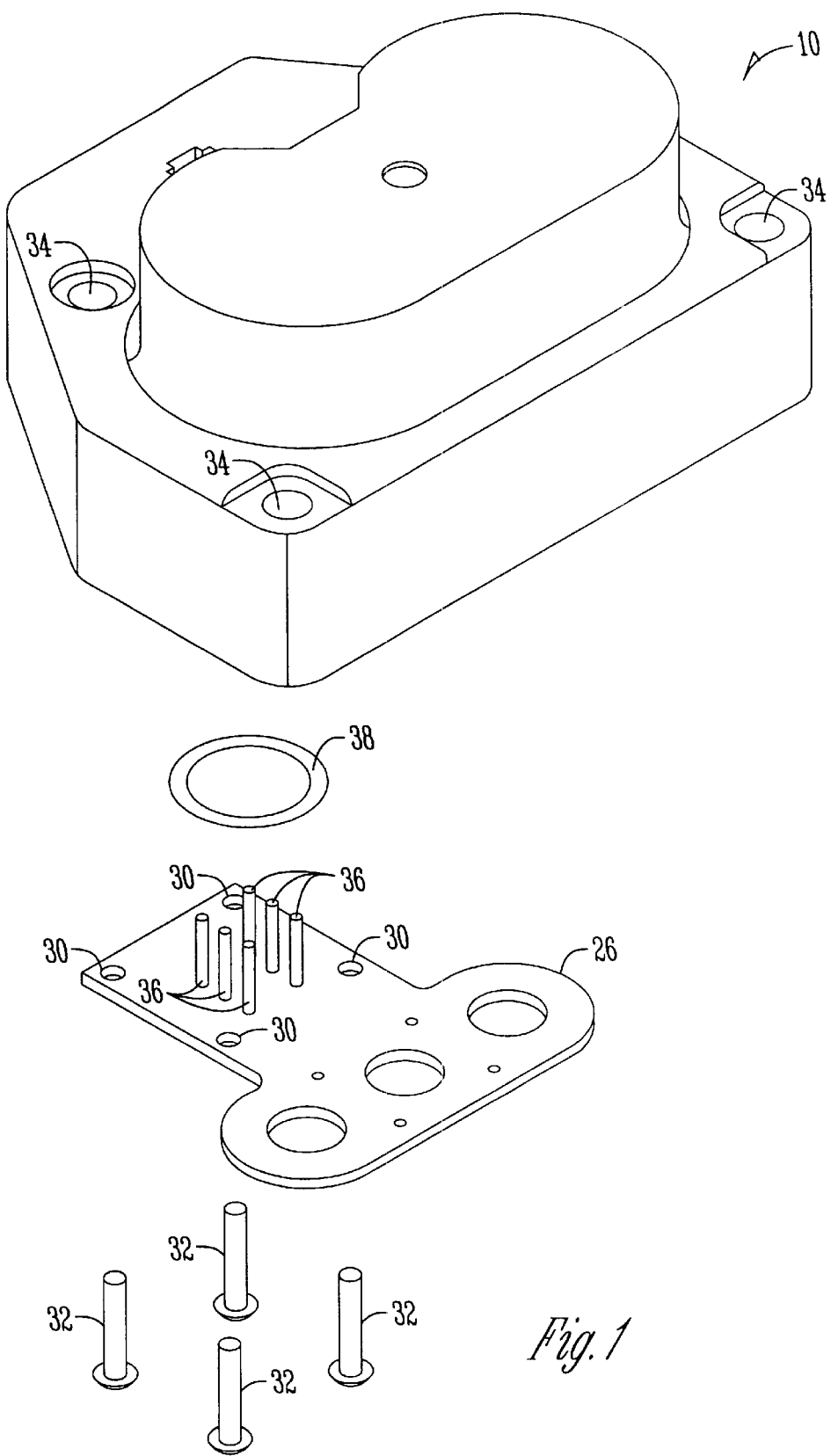
FIG. 1 is an exploded perspective view showing the cover of this invention.
Figure 2:
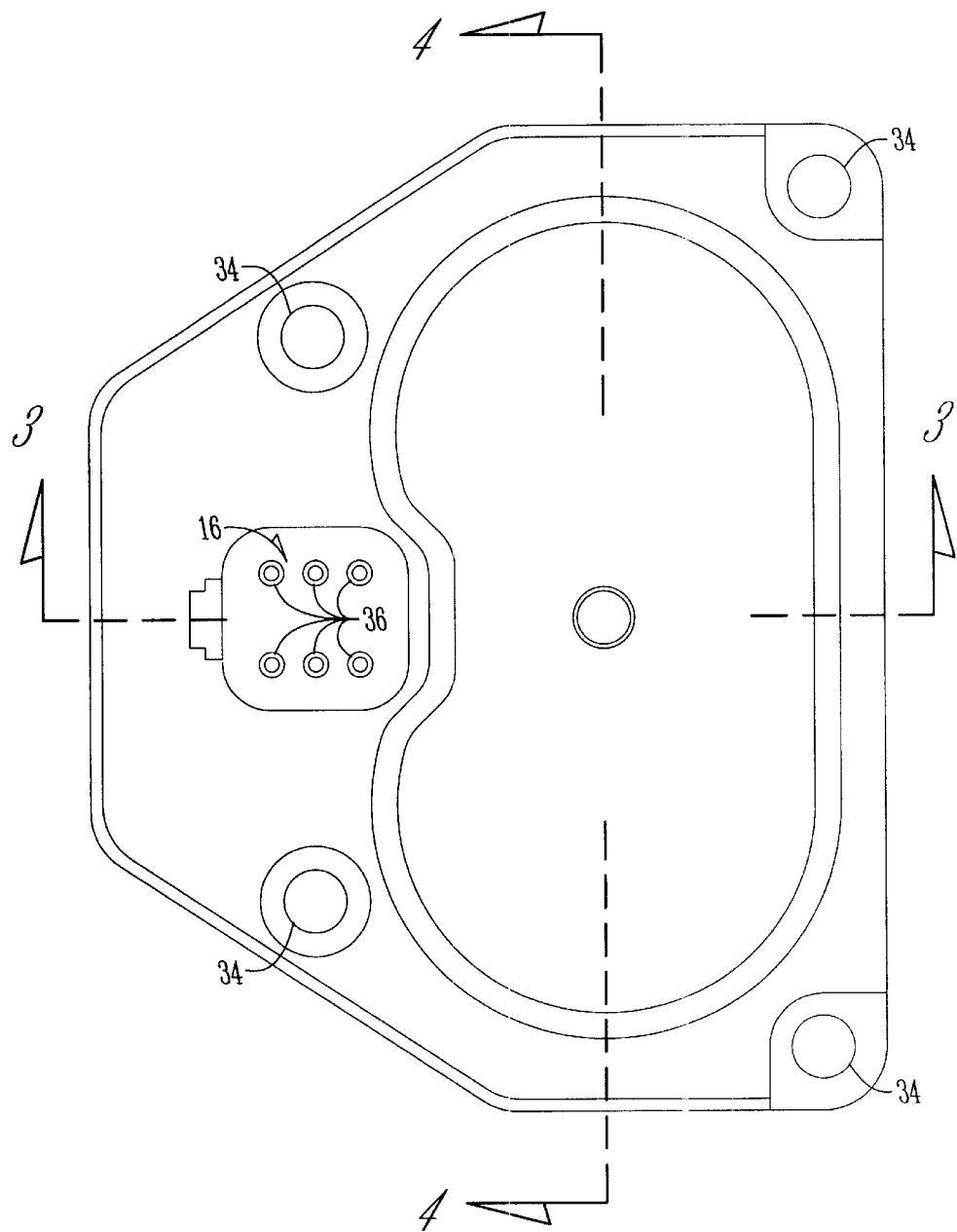
FIG. 2 is a plan view thereof.

Apertures 30 are located in board 26 as best shown in FIG. 1 to receive mounting screws 32 which extend through the apertures 30 and into suitable apertures (not shown) in the cover 10. Apertures 34 (FIG. 1) are located in cover 34 to receive screws (not shown) for affixing the cover to the pump 12.

A plurality of connecting pins 36 extend through terminal wall 22 and extend upwardly into exterior compartment 16 as shown in FIG. 3. The connecting pins are connected to the printed circuit on the lower surface of board 26. A resilient seal 38 (FIGS. 1 and 3) of Nitrile rubber is mounted in annular groove 40 to effectively seal the printed circuit board 26 to the cover 10 when the screws 32 (FIG. 3) are tightened into position.

With reference to FIG. 5, the pump 12 has a pump housing 42 with a face 43 complimentary in shape to the face 24 of cover 10. The faces 43 and 24 of the pump 12 and the cover 10 are interfaced and held tightly together by screws or the like which extend through apertures 34 of cover 10 and into corresponding apertures (not shown) in the pump housing 42, with the board 26 therebetween. An electrical control component 44, such as a Hall Effect sensor is mounted within the pump housing 42 along with a conventional hydraulic component 46. In the assembled condition of FIG. 5, the cover 10 and the pump housing 12 have created an effective electrical circuit including the connecting pins 36, the printed circuit board 26, the surface mounted electrical components 28, the electrical control components 18 in compartment 14, the sensor 44 in pump housing 42 and the hydraulic component 46 in the pump housing. A suitable connector can be imposed on pins 36 in exterior compartment 16 to connect the foregoing circuit to an exterior circuit. Most importantly, with hydraulic fluid filling the interior of pump housing 42 and the interior compartment 14 of cover 10, the seal 38 will prevent leakage of hydraulic fluid out of the pump 12, and will similarly prevent the entrance of foreign fluid which might accumulate in compartment 16 from entering the pump.

It is also seen that the cover 10 can easily be mounted on or removed from the pump housing 12 for installation or repair purposes.

It is therefore seen that this invention will accomplish at least all of its stated objectives.

What is claimed is:

1. An electronic connection cover for a hydraulic component housing, comprising, a cover housing with interior and exterior compartments, and a face for interfacing with an opening in a hydraulic component housing, an electrical control component in the interior compartment for electrical controlling of a hydraulic component in a hydraulic component housing, the face of the cover housing having a terminal wall closing an end to the exterior compartment opposite an open end of the exterior compartment, a printed circuit board secured to the face of the cover housing and superimposed over the terminal wall and having an electrical circuit including surface mounted electrical components imposed on one side thereof opposite to the terminal wall, the electrical circuit being operatively connected to the electrical control components in the interior compartment, the surface mounted electrical components being positioned for interaction with electrical control components in a hydraulic component housing to which the cover is attached, connecting pins extending from the electrical circuit through the printed circuit board and the terminal wall and protruding into the exterior compartment for connection to exterior circuitry, and a seal element between the terminal wall and the printed circuit board to prevent the passage of hydraulic fluid into or out of a hydraulic component housing to which the cover is attached.

2. A combination of a hydraulic component housing and an electronic connection cover comprising, a cover housing with interior and exterior compartments and a face for interfacing with an opening in a hydraulic component housing;

a hydraulic component housing with a hydraulic component therein associated with an electronic control element is interfaced with the cover housing and secured thereto;

the hydraulic component housing having an opening complimentary in shape to the face of the cover housing and being superimposed thereover;

an electrical control component in the interior compartment of the cover housing for electrical control of the hydraulic component in the hydraulic component housing;

the face of the cover housing having a terminal wall closing an end to the exterior compartment opposite an open end of the exterior compartment;

a printed circuit board secured to the face of the cover housing and superimposed over the terminal wall and having an electrical circuit including surface mounted electrical components imposed on one side thereof opposite to the terminal wall;

the printed circuit board being positioned between the interfaces of the cover housing and the hydraulic component housing;

the electrical circuit being operatively connected to the electrical control component in the interior compartment;

the surface mounted electrical components being positioned for interaction with the electrical control components in the hydraulic component housing;

connecting pins extending from the electrical circuit through the printed circuit board and the terminal wall and protruding into the exterior compartment for connection to exterior circuitry;

the electronic control element in the hydraulic component housing being operatively associated with the electrical circuit in the printed circuit board to effect electronic association with the electrical control component in the interior compartment of the cover housing; and a seal element between the terminal wall and the printed circuit board to prevent the passage of hydraulic fluid into or out of the hydraulic component housing.

3. A combination of a hydraulic component housing with a hydrostatic component and an electronic control component therein, and an electronic connection cover interfaced with the hydraulic component housing, comprising, a printed circuit board interfaced between the hydraulic component housing and the electronic connection cover, means for securing the hydraulic component housing and the electronic connection cover together with the printed circuit board therebetween, each of the housings having interior compartments fluidly interconnected, an electronic control element in the electronic connection cover, a printed circuit on a face of the electronic connection cover and exposed to the interior of the hydraulic component housing, and being associated with the electronic control element in the electronic connection cover and the electronic control component in the hydraulic component housing, electrical contacts extending from the printed circuit through the printed circuit board and the electronic connection cover for external connection to an exterior circuit, and a seal element between the printed circuit board and the electronic control circuit which surrounds the area where the electrical contacts extend through the printed circuit board.

4. The combination of claim 3 wherein the printed circuit board is connected to the electronic connection cover.

5. An electronic connection cover for a hydraulic component, comprising, a housing structure having an interior compartment and an electronic control element in the interior compartment, the housing structure having a face for interfacing a hydrostatic component housing, a printed circuit board affixed to the face of the housing structure, a printed circuit on the printed circuit board on a side thereof opposite to the housing structure, and being connected to the electronic control element, electrical contacts extending from the printed circuit through the printed circuit board and the electronic connection cover for external connection to an exterior circuit, and a seal element between the printed circuit board and the electronic control circuit which surrounds the area where the electrical contacts extend through the printed circuit board.

* * * * *